(12) United States Patent
Mizushima et al.

(10) Patent No.: US 9,479,194 B2
(45) Date of Patent: Oct. 25, 2016

(54) DATA COMPRESSION APPARATUS AND DATA DECOMPRESSION APPARATUS

(71) Applicant: Hitachi, Ltd., Tokyo (JP)

(72) Inventors: Nagamasa Mizushima, Tokyo (JP); Hideyuki Koseki, Tokyo (JP); Atsushi Kawamura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 328 days.

(21) Appl. No.: 14/360,500

(22) PCT Filed: Aug. 9, 2013

(86) PCT No.: PCT/JP2013/071617
§ 371 (c)(1),
(2) Date: May 23, 2014

(87) PCT Pub. No.: WO2015/019484
PCT Pub. Date: Feb. 12, 2015

(65) Prior Publication Data
US 2016/0233880 A1 Aug. 11, 2016

(51) Int. Cl.
*H03M 7/42* (2006.01)
*H03M 7/30* (2006.01)
*G06F 3/06* (2006.01)

(52) U.S. Cl.
CPC ............ *H03M 7/3084* (2013.01); *G06F 3/065* (2013.01); *G06F 3/0619* (2013.01); *G06F 3/0688* (2013.01); *H03M 7/3086* (2013.01); *H03M 7/3088* (2013.01)

(58) Field of Classification Search
CPC ........... H03M 7/3084; H03M 7/3086; H03M 7/3088; G06F 3/0688; G06F 3/065; G06F 3/0619
USPC .......................................... 341/106, 107, 87
See application file for complete search history.

(56) References Cited

U.S. PATENT DOCUMENTS

| 5,831,558 A * | 11/1998 | Harvell ............... | H03M 7/3088 341/106 |
| 6,121,901 A * | 9/2000 | Welch ..................... | H03M 7/46 341/51 |
| 6,529,912 B2 * | 3/2003 | Satoh .................. | H03M 7/3084 707/693 |
| 7,167,115 B1 * | 1/2007 | Mondal ............... | H03M 7/3088 341/51 |
| 8,326,605 B2 * | 12/2012 | Balegar ............... | H03M 7/3084 341/51 |
| 2010/0017424 A1 | 1/2010 | Hughes | |
| 2010/0246983 A1 | 9/2010 | Hosokawa | |
| 2011/0231629 A1 | 9/2011 | Shiraishi | |

FOREIGN PATENT DOCUMENTS

| JP | 10-187410 A | 7/1998 |
| JP | 2005-269184 A | 9/2005 |
| JP | 2010-068511 A | 3/2010 |
| JP | 2011-193406 A | 9/2011 |
| JP | 2013-150041 A | 8/2013 |
| WO | 2009/057459 A | 5/2009 |

* cited by examiner

*Primary Examiner* — Brian Young
(74) *Attorney, Agent, or Firm* — Volpe and Koenig, P.C.

(57) ABSTRACT

The present invention guarantees throughput for decompressing compressed data. A data compression apparatus includes: a division unit that divides plaintext data inputted to the division unit into a plurality of plaintext blocks each having a prescribed plaintext block length; a compression unit that creates a payload for each plaintext block of the plurality of plaintext blocks by compressing the plaintext block using a sliding dictionary-type compression algorithm, creates a header indicating the length of the payload, and creates a compression block that includes the header and the payload; and a concatenation unit that creates compressed data by concatenating a plurality of compression blocks created from the plurality of plaintext blocks.

8 Claims, 12 Drawing Sheets

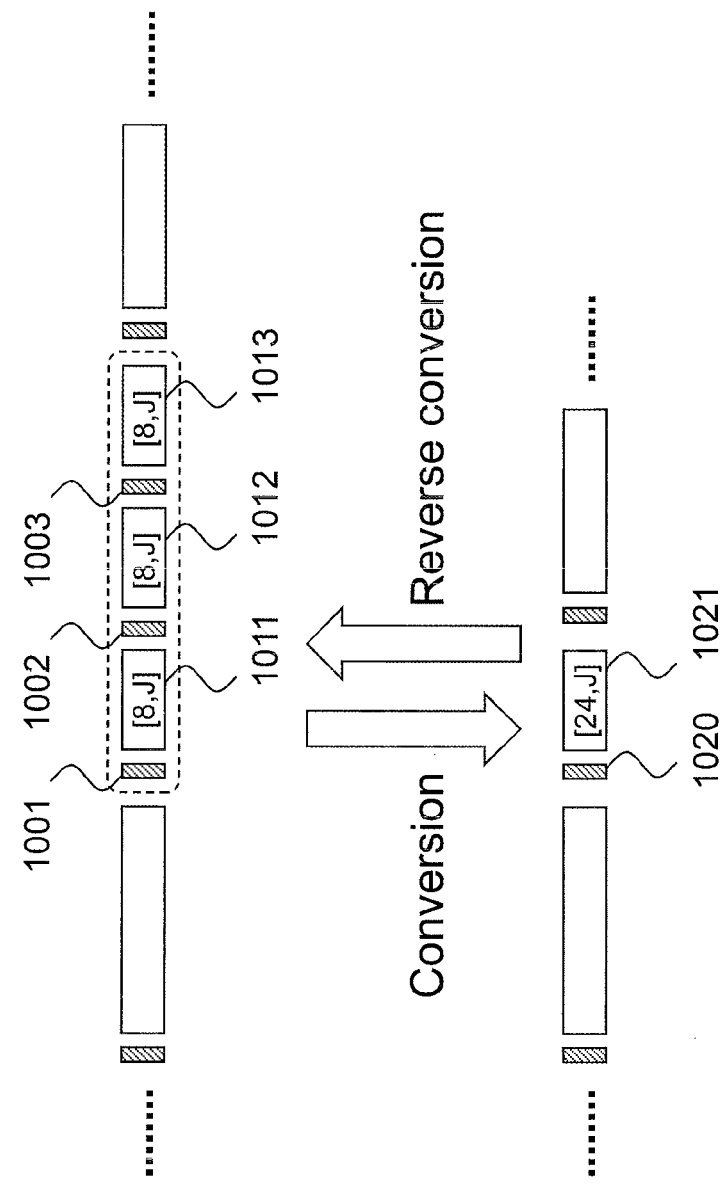

DATA COMPRESSION APPARATUS AND DATA DECOMPRESSION APPARATUS

TECHNICAL FIELD

The present invention relates to technology for data compression and data decompression.

BACKGROUND ART

LZ77 is an extremely common reversible data compression algorithm developed by Lempel and Ziv in 1977. The principle of LZ77 is sliding dictionary-type compression. The LZ77, while moving a pointer from the beginning to the end of a character string stream, searches for the longest match to a character string that starts from the current pointer in a character string stream of a prescribed length in the past from the current pointer (called a sliding dictionary). In addition, the LZ77 reduces the amount of data in a character string stream by converting the character string indicated by the current pointer to copy symbols, and compresses the character string stream. In addition to having a simple principle and being easy to implement, the LZ77 is also known for having relatively good compressibility. The size of the sliding dictionary is arbitrary, and a larger size sliding dictionary increases the probability of matching a character string, thereby improving compressibility.

Storage systems for storing and managing large amounts of data are being equipped with data compression functions to make it possible to lower per-capacity-cost when larger amounts of data are being stored. Storage systems are classified into two types: file storage for managing data in file units, and block storage for managing data in fixed-size sector units. Regardless of the type of storage system, the compression methods being employed in the data compression functions are by and large the above-described LZ77, or an algorithm derived from the LZ77.

Patent Literature 1 discloses a technique for the high-speed decompression of data compressed on the basis of the LZ77. A parallelization technique for decompressing compressed data at high speed by processing software using a general-purpose processor is also disclosed in Patent Literature 1. This technique divides plaintext data to be compressed into a plurality of blocks and compresses each block. The number of blocks is determined on the basis of the parallel processing capabilities of the processor (number of cores and so forth) used at decompression.

CITATION LIST

Patent Literature

[PTL 1]
Japanese Patent Application Laid-open No. 2010-068511

SUMMARY OF INVENTION

Technical Problem

When plaintext data is divided into a plurality of blocks of the same size, each of the blocks is compressed, and decompression is performed using software, the time required to decompress each block will differ depending on the data content. With respect to this problem, Patent Literature 1 discloses a method for varying the size of each block, adjusting the division boundaries by repeating compression and decompression on a trial basis, and equalizing decompression times.

In a storage system or communication system, there are cases in which the throughput for outputting data is guaranteed. When a system like this decompresses compressed data and outputs the decompressed data, there are cases where the throughput cannot be guaranteed for software-based decompression.

Solution to Problem

To resolve the aforementioned problems, a data compression apparatus, which is one aspect of the present invention, includes: a division unit that divides plaintext data inputted to the division unit into a plurality of plaintext blocks each having a prescribed plaintext block length; a compression unit that creates a payload for each plaintext block of the plurality of plaintext blocks by compressing the plaintext block using a sliding dictionary-type compression algorithm, creates a header indicating the length of the payload, and creates a compression block that includes the header and the payload; and a concatenation unit that creates compressed data by concatenating a plurality of compression blocks created from the plurality of plaintext blocks.

A data decompression apparatus, which is another aspect of the present invention, includes: an extraction unit that uses compressed data created by: dividing plaintext data into a plurality of plaintext blocks, each of the plurality of plaintext blocks having a prescribed plaintext block length; creating a payload for each plaintext block of the plurality of plaintext blocks by compressing the plaintext block using a sliding dictionary-type compression algorithm; creating a header indicating the length of the payload; creating a compression block that includes the payload and the header; and concatenating a plurality of compression blocks created for the plurality of plaintext blocks, to recognize each header of the plurality of compression blocks from the compressed data, and extract the payload from the compressed data on the basis of the payload length indicated in the recognized header; and a decompression unit that restores the plaintext block by decompressing the extracted payload using the sliding dictionary-type compression algorithm.

Advantageous Effects of Invention

According to an aspect of the present invention, it is possible to guarantee throughput for decompressing compressed data.

BRIEF DESCRIPTION OF DRAWINGS

FIG. 12 shows a specific example of secondary compression.

DESCRIPTION OF EMBODIMENTS

Examples of the present invention will be explained using the drawings.

Example 1

A storage apparatus that utilizes flash memory as the storage media will be explained below as an example of the present invention.

In recent years, as storage media for storage systems, attention has focused on flash memory storage, such as solid state drives (SSD) mounted with large numbers of NAND-type flash memories, which is a nonvolatile semiconductor memory, either in addition to or in place of hard disk drives (HDD).

A flash memory does not possess a head-seek mechanisms like an HDD, and as such, latency is minimal at data access. Therefore, the flash memory has outstanding speed performance in a random data read. As such, the switch from HDD to flash memory storage as the storage media in storage systems is progressing in applications such as databases for which high-speed random reads are required. However, although the bit cost for flash memory storage is becoming cheaper year by year pursuant to the high integration of flash memory cells as a result of refinements in semiconductor processes, this bit cost is still between three- and 10-times higher than that of HDDs. For users who set a high value on storage system installation costs, the bit cost of the flash memory storage is cause for hesitation when considering employing flash memory storage.

Accordingly, the size of the physical data stored in a flash memory can be reduced by implementing a data compression technique in the flash memory storage. In so doing, the storage capacity of the flash memory storage can be made to appear virtually larger, enabling the bit cost to be reduced.

Figure 1:
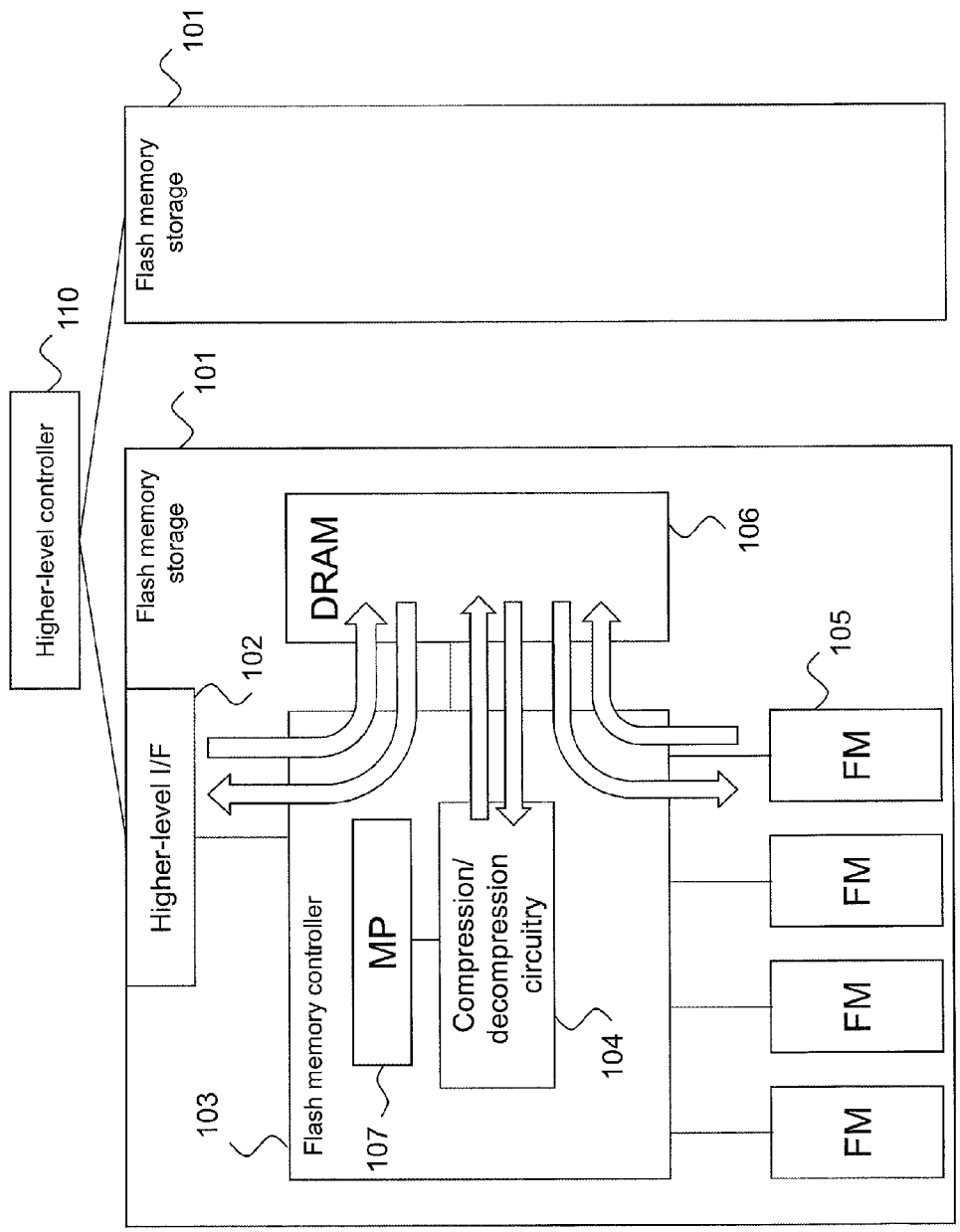
FIG. 1 shows the configuration of a flash memory storage 101 in an example of the present invention.

FIG. 1 shows the configuration of a computer system in an example of the present invention. The computer system includes a higher-level controller 110, and a plurality of flash memory storages 101. The higher-level controller 110 is connected to the flash memory storage 101, and controls the flash memory storage 101. The computer system may include a single flash memory storage 101. The flash memory storage 101 includes a higher-level interface (I/F) 102, a flash memory controller 103, a plurality of flash memories 105, and a dynamic random access memory (DRAM) 106, which is a volatile memory. The flash memory 105 is a chip including a NAND-type flash memory.

The flash memory controller 103 includes compression/decompression circuitry 104, and a microprocessor (MP) 107. The microprocessor 107 is also connected to the higher-level I/F 102, the flash memory 105, and the DRAM 106, and controls these elements. The microprocessor 107, in accordance with programs stored in the DRAM 106, executes processing for interpreting the contents of a read/write command from the higher-level controller 110, sending/receiving data to/from the higher-level controller 110, controlling the compression/decompression of data by the compression/decompression circuitry 104, and transferring data to and from the flash memory 105 and the DRAM 106. The computer system may be a storage system or a server system. The higher-level controller 110 in a storage system, for example, is a storage controller for controlling redundant arrays of independent disks (RAID) that use the flash memory storage 101. The storage controller is connected to a host computer via a network, such as a storage area network (SAN), and controls the flash memory storage 101 in accordance with a read/write command from the host computer. The higher-level controller 110 in a server system, for example, is a server computer that performs a read/write relative to the flash memory storage 101.

The higher-level I/F 102 is an interface mechanism for connecting to the higher-level controller 110, and responds to a read/write command for sending data to the higher-level controller 110 and receiving data from the higher-level controller 110. The higher-level I/F 102 mechanism and protocols for sending and receiving commands and data, for example, conform to interface specifications that are compatible with the HDD.

The compression/decompression circuitry 104 is logic circuitry for compressing and decompressing data. The compression/decompression circuitry 104 reversibly compresses write data received in accordance with a write command from the higher-level controller 110 and creates compressed data in order to reduce the amount of data stored in the flash memory 105. In addition, the compression/decompression circuitry 104 decompresses compressed data read from the flash memory 105 and creates plaintext data in order to send plaintext data to the higher-level controller 110 in accordance with a read command from the higher-level controller 110.

The microprocessor 107 first stores write data from the higher-level controller 110 in the DRAM 106. At this time, the microprocessor 107 returns a write-complete response to the higher-level controller 110. Thereafter, the microprocessor 107 instructs the compression/decompression circuitry 104 to compress the write data. In accordance with this instruction, the compression/decompression circuitry 104 compresses the write data to convert the write data to compressed data, and stores the compressed data in the DRAM 106. Then, the microprocessor 107 writes the compressed data to the flash memory 105.

The microprocessor 107 reads the compressed data from the flash memory 105 in accordance with a read command from the higher-level controller 110, and stores the compressed data in the DRAM 106. Thereafter, the microprocessor 107 instructs the compression/decompression circuitry 104 to decompress the compressed data. In accordance with this instruction, the compression/decompression circuitry 104 decompresses the compressed data to convert the compressed data to plaintext data, and stores the plaintext data in the DRAM 106. Then, the microprocessor 107 sends the plaintext data stored in the DRAM 106 to the higher-level controller 110.

Thus, for a data write, since the microprocessor 107 executes compression processing after returning a write-complete, the write performance of the flash memory storage 101 as seen from the higher-level controller 110 is constant regardless of whether or not compression is performed. Alternatively, because a data read is not completed until the microprocessor 107 has finished returning the read data to the higher-level controller 110, the read performance of the flash memory storage 101 as seen from the higher-level controller 110 depends on the time it takes to decompress the compressed data. That is, the read performance of the flash memory storage 101 can be improved when the compression/decompression circuitry 104 performs a high-speed real-time decompression process.

The compression/decompression circuitry 104 is implemented as logic circuitry. The compression/decompression circuitry 104 has high-speed data decompression throughput, and as such, for compressed data as well as non-compressed data, makes it possible to realize high-speed random read performance, which is a characteristic feature of the flash memory storage 101. In the storage system, when a compressed data read request arrives from the higher-level controller 110, it is preferable that the decompression of the compressed data be performed as fast as possible so that the throughput for decompressing the compressed data and restoring the plaintext data to the higher-level controller 110 does not deteriorate significantly compared to a normal non-compressed data read.

A use case of the present invention is not limited to a flash memory storage 101. The present invention can also be applied to a data compression function of another storage system. Reducing capacity costs by using a storage equipped with a compression function has been attempted in conventional storage systems as well. However, because it is difficult to guarantee the read performance of compressed data in a conventional storage system, the data compression function is most often used for static data that is read accessed infrequently, such as backup data and/or snapshot images. According to a storage system that applies the present invention, high-speed read performance can be guaranteed for compressed data as well, thereby making it possible to use the data compression function for dynamic data that is read-accessed frequently.

A data compression/decompression method using a common sliding dictionary-type algorithm based on LZ77 will be explained below.

The well-known Deflate algorithm defined in Request for Comments (RFC) 1951 will be explained here. A data compression function for compressing data and a data decompression function for decompressing data are realized using either software or hardware.

Figure 2:
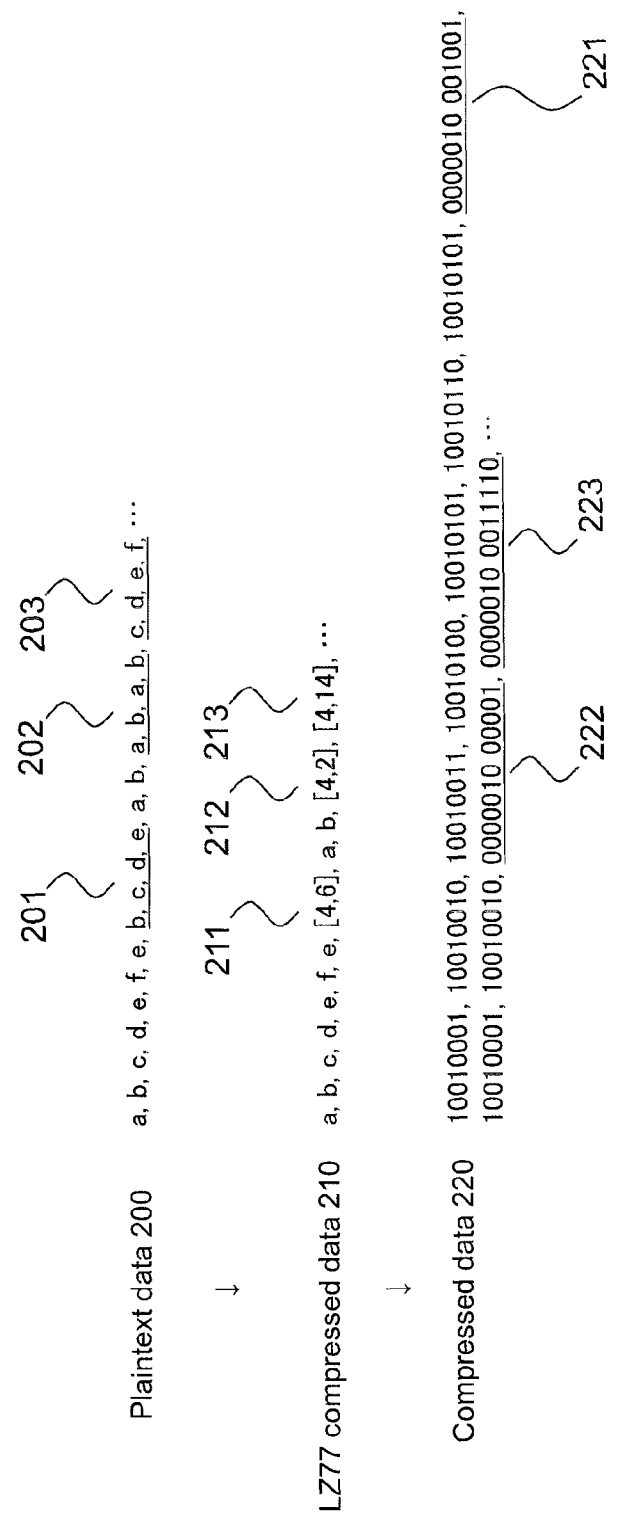
FIG. 2 shows an example of data compression in accordance with the Deflate algorithm.

FIG. 2 shows an example of data compression using the Deflate algorithm.

Data compression using the Deflate algorithm includes LZ77 compression and the encoding of a bit pattern. The drawing shows plaintext data 200 expressed as a character string, LZ77 compressed data 210, which is a character string for which the plaintext data 200 has been compressed using LZ77, and compressed data 220, which is a bit pattern obtained by encoding the LZ77 compressed data 210. The encoding, for example, is Huffman encoding.

The data compression function sequentially checks whether or not a character string, which is the same as a character string that has occurred, occurs again later in the plaintext data 200, which is a character string stream. In accordance with this, when a certain character string matches up with L successive characters from J characters in front of the first character thereof, the data compression function converts this character string to a copy symbol [L, J] L is called the copy length and J is called the copy distance. For example, the four-character character string 201 "b,c,d,e" matches up with four successive characters from six characters in front of the first character "b". In this case, the data compression function converts the character string 201 to the copy symbol 211 [4, 6]. Similarly, the four-character character string 202 "a,b,a,b" matches up with four successive characters from two characters in front of the first character "a" to include portions that duplicate one another. In this case, the data compression function converts the character string 202 to the copy symbol 212 [4, 2]. Similarly, a four-character character string 203 "c,d,e,f" matches up with four successive characters from 14 characters in front of the first character "c". In this case, the data compression function converts the character string 203 to the copy symbol 213 [4, 14].

Since the data amounts of these copy symbols 211, 212, and 213 is less than the data amounts of the original character strings 201, 202, and 203, the conversions make it possible to create LZ77 compressed data 210 that decreases the data amount of the plaintext data 200. Alternatively, the data compression function does not perform such a conversion for a character that occurs for the first time in the plaintext data 200 and/or a character string in which the number of successively matching characters is less than three characters (that is, L<3) because the data amount of the original character string is sufficiently small.

The range of the character string stream (hereinafter called a dictionary) to be referenced in the above-described match search will be assumed to be a range from one character in front of the relevant character string toward the past (forward) by a number of characters of a prescribed dictionary size. This is because failure to limit the dictionary size will result in a large amount of data represented by the J (restore quantity) of the copy symbol [L, J], and will lower the effect of reducing the data amount. Failure to limit the dictionary size will also increase the search time and lower performance. Because the dictionary range slides rearward for each search, the dictionary is called a sliding dictionary, and the LZ77 is one of the sliding dictionary-type compression algorithms (sliding dictionary scheme).

When a plurality of matching character strings exists within the sliding dictionary, the data compression function converts the longest successively matching character string to a copy symbol. This has the effect of decreasing the data amount even more.

Thus, LZ77 compression is character string conversion for reducing the data amount by using a past range of character strings up to the dictionary size as a sliding dictionary.

Performing LZ77 compression alone still does not create compressed data. The copy symbol is simply a symbol that represents the act of copying, and is not compressed data. To create compressed data, the data compression function uses a prescribed encoding scheme to encode characters that have not been converted to a copy symbol (hereinafter called literal characters) and the copy symbols, and concatenates these encoded characters and copy symbols to form a bit stream. The bit stream is the result of encoding in accordance with the Deflate rules, and is the ultimately created compressed data 220.

Within the compressed data 220, a bit pattern 221 is 13 bits in length and is the code word for the copy symbol [4, 6], a bit pattern 222 is 12 bits in length and is the code word for the copy symbol [4, 2], and a bit pattern 223 is 14 bits in length and is the code word for the copy symbol [4, 14]. Within the compressed data 220, the other bit patterns are eight bits in length, and are the code words for the literal characters. Thus, the bit pattern length of the respective code words in the compressed data 220 is not fixed.

Figure 3:
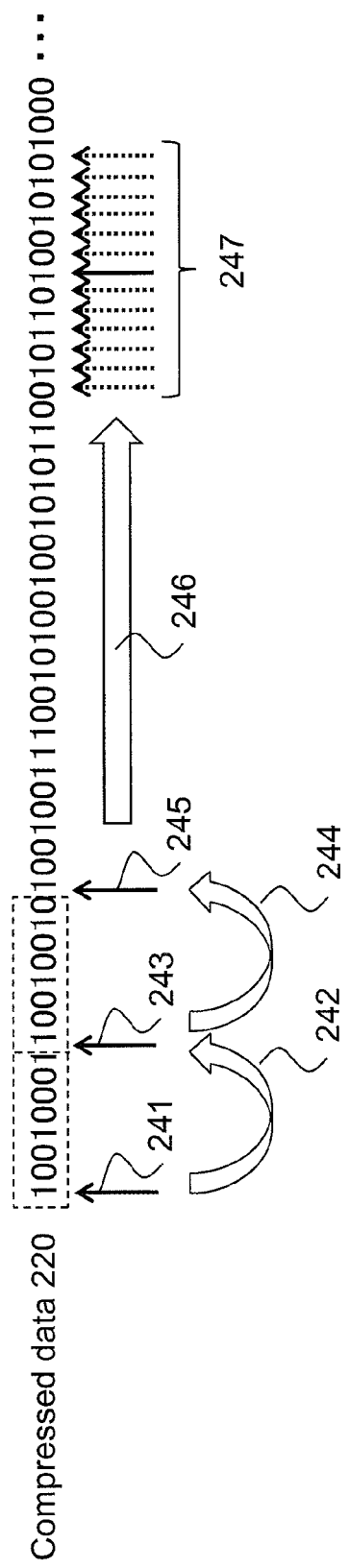
FIG. 3 shows an example of data decompression in accordance with the Deflate algorithm.

FIG. 3 shows an example of data decompression using the Deflate algorithm.

The data decompression function uses the compressed data 220 bit stream as input, and restores the original plaintext data 200 by reversing the processing of the data compression function.

In order to restore the compressed data 220 to the symbolic representation of the LZ77 compressed data 210, first the data decompression function must extract the individual bit patterns (code words) from within the compressed data 220 bit stream concatenated from a plurality of bit patterns. However, since the bit pattern length of each code word is not fixed, it is impossible to immediately extract the bit patterns from random positions. Basically, the data decompression function sets an extraction pointer at the beginning of the compressed data 220 bit stream, and sequentially extracts the bit patterns rearward one at a time.

For example, the data decompression function sets the extraction pointer at the first position 241 in the compressed data 220, and when it becomes clear that the bit pattern "10010001" that begins therefrom represents the character "a", moves (242) the extraction pointer and sets the extraction pointer at position 243. Then, when it becomes clear that the bit pattern "10010010" that begins therefrom represents the character "b", the data decompression function moves (244) the extraction pointer and sets the extraction pointer at position 245. Thus, the data decompression function determines the extraction pointer position only after being able to distinguish the previous bit pattern. Generally speaking, the encoding process for restoring the compressed data 220 to the symbolic representation of the LZ77 compressed data 210 is an inefficient serial process like this.

However, it is possible to apply parallel processing to the encoding process. Since the data decompression function knows the variations of the code word bit pattern lengths beforehand, the data decompression function is able to enumerate extraction point candidates 247 indicative of all the possible code word arrangements. For example, the data decompression function can learn beforehand that one real extraction point exists among the extraction point candidates 247. Accordingly, the data decompression function not only pushes forward with code word extraction from the start of the bit stream, but also simultaneously commences provisional extraction at each point within the extraction point candidates 247. When extractions throughout the range 246 have ended, one valid extraction point is determined from among the candidates 247. At the determination time point, extraction has already moved forward from this extraction point, thereby improving processing performance. However, when attempting to realize this technique using hardware, a large number of bit pattern decoders must be deployed, making the scale of the circuit extremely large. Therefore, realistically this technique is not possible.

The compression/decompression circuitry 104 of this example will be explained below.

The compression/decompression circuitry 104 makes it possible to curb increases in costs resulting from the scale of the data decompression circuit used in hardware processing, and to increase speed.

Figure 4:
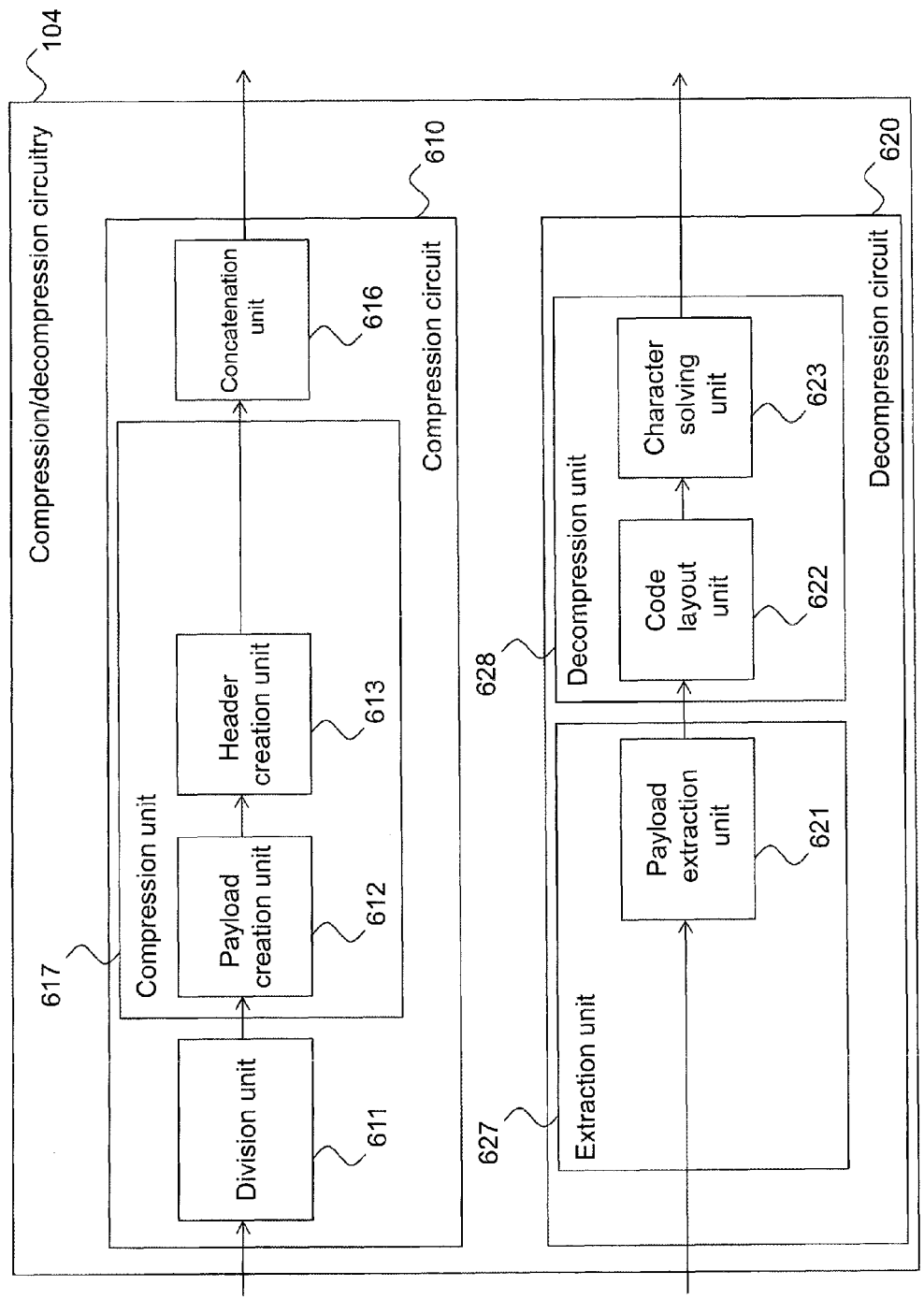
FIG. 4 shows the configuration of compression/decompression circuitry 104 of a first example.

FIG. 4 shows the configuration of the compression/decompression circuitry 104 in the first example.

The compression/decompression circuitry 104 includes a compression circuit 610 for performing data compression processing, and a decompression circuit 620 for performing data decompression processing.

The compression circuit 610 includes a division unit 611, a compression unit 617, and a concatenation unit 616. Plaintext data is inputted to the division unit 611. The compression unit 617 includes a payload creation unit 612, and a header creation unit 613. The division unit 611 divides the plaintext data into a plurality of plaintext blocks. The payload creation unit 612 creates a compression payload by compressing the plaintext blocks using a sliding dictionary-type compression algorithm. The header creation unit 613 creates a header indicating the length of the compressing payload, and creates a compression block that includes the compression header and the compression payload. The concatenation unit 616 creates compressed data by concatenating a plurality of compression blocks.

The compression header may be called the header. Also, the compression payload may be called the payload.

The decompression circuit 620 includes an extraction unit 627 and a decompression unit 628. The extraction unit 627 includes a payload extraction unit 621. The decompression unit 628 includes a code layout unit 622 and a character solving unit 623. The compressed data is inputted to the payload extraction unit 621. The payload extraction unit 621 recognizes the compression header within the compressed data, and extracts the compression payload from the compressed data on the basis of the payload length indicated by the recognized compression header. The code layout unit 622 converts the compression payload to an intermediate block that is the same length as the plaintext block. The character solving unit 623 restores a plaintext block by solving indeterminate characters in the intermediate block using the sliding dictionary. The code layout unit 622 and the character solving unit 623 include pipelines for converting the compression payload into the plaintext block.

The data compression process in this example will be explained below.

In the data compression process of this example, plaintext data that is to be compressed is divided into a plurality of plaintext blocks of equal size. It is assumed that the length of the plaintext block is N [bytes]. The value of N is determined, using the drive clock frequency of the decompression circuit 620, as an output throughput value, which is the throughput by which the decompression circuit 620 decompresses the compressed data and outputs the plaintext data. The output throughput value may be a transmission rate via which the higher-level I/F 102 sends read data to the higher-level controller 110, or may be faster than this transmission rate. For example, when the output throughput value is X [MB/s] and the drive clock frequency is F [MHz], it is determined that N=X/F. Furthermore, one byte of the plaintext data 400 signifies one character. That is, each plaintext block obtained by dividing the plaintext data includes an N-character character string. This makes it possible to output plaintext data at a predetermined output throughput in accordance with the decompression circuit 620 decompressing the compressed data and outputting N-bytes of plaintext data during each drive clock cycle.

Figure 5:
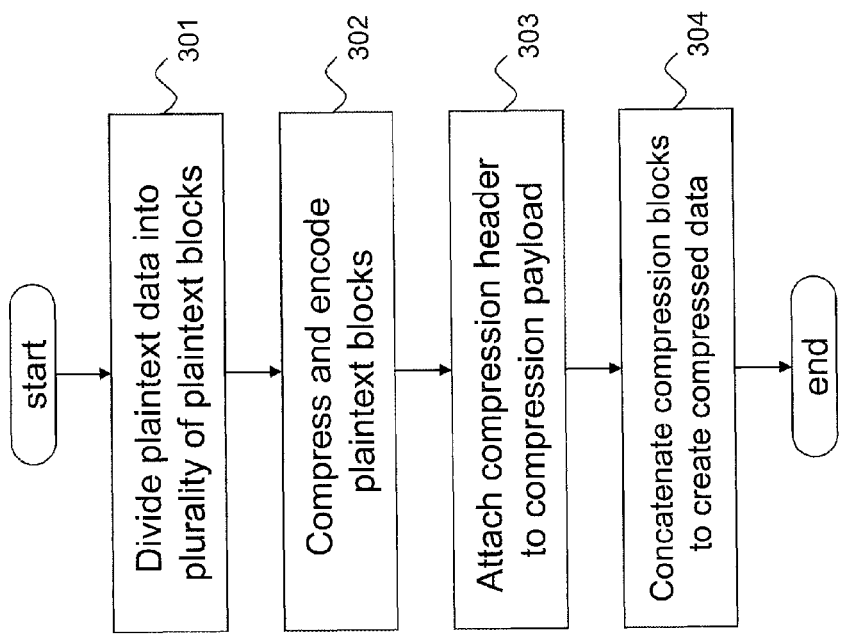
FIG. 5 shows data compression processing of the first example.

FIG. 5 shows the data compression processing in the first example.

First, the division unit 611 divides the inputted plaintext data into a plurality of blocks in units of N characters (bytes) (301). Next, the payload creation unit 612 uses LZ77 compression like that described hereinabove to compress each plaintext block obtained by dividing the plaintext data, and creates a bit stream in accordance with bit pattern encoding (302). The bit stream is called a compression payload.

In Step 302, the payload creation unit 612 performs LZ77 compression for each plaintext block in accordance with the following two rules.

The first rule is that the range of the sliding dictionary may extend beyond the plaintext block boundary. That is, the sliding dictionary has a prescribed dictionary size and slides toward the rear of the plaintext data regardless of the plaintext block boundary the same as in ordinary LZ77 compression.

The second rule is that, while performing a match search between a character string in a plaintext block and the sliding dictionary, the search stops when the character string reaches the tail end of the plaintext block. That is, a character string that extends beyond the boundary of the plaintext block is not converted to a single copy symbol. For example, when a 10-character character string also exists J characters in front of the first character of the 10-character character string, and the plaintext block boundary exists between the front six characters and the rear four characters of the character string, the front six characters are converted to the copy symbol [6, J] and included before the boundary, and the rear four characters are converted to the copy symbol [4, J] and included after the boundary.

Following Step 302, the header creation unit 613 computes the number of bits of the compression payload length, creates a compression header indicating this length, and makes compression blocks by attaching a compression header immediately in front of each compression payload (303). The compression header, for example, is a bit pattern (1001010 in the case of 74 bits) that represents the compression payload bit length itself. However, the compression header is not limited thereto, and may be any data that specifies the bit length of the compression payload.

Lastly, the concatenation unit 616 creates compressed data 440 (a bit stream) by concatenating all of the compression blocks (304) and ends the flow.

Figure 6:
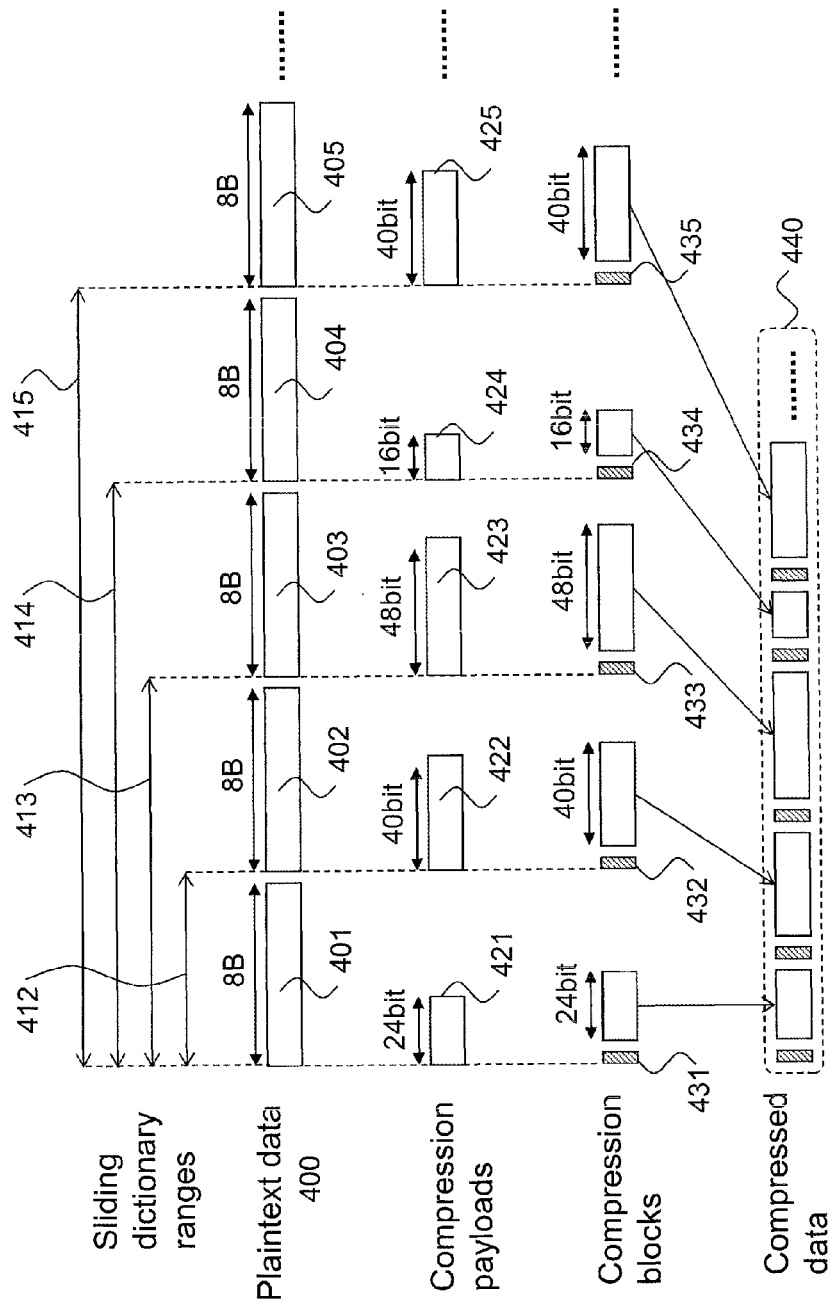
FIG. 6 shows a specific example of the data compression processing of the first example.

FIG. 6 shows a specific example of the data compression processing in the first example.

For example, it is assumed that the output throughput value of read data in the flash memory storage 101 is 1600 MB/s and that the drive clock frequency of the compression/decompression circuitry 104 is 200 MHz. According to the calculation method for the plaintext block length described hereinabove, the plaintext block length N is 8. In the following explanation, N will be regarded as 8. The division unit 611 divides the plaintext data into 8-byte units. In this specific example, the 40 bytes from the start of the plaintext data 400 is divided into plaintext blocks 401, 402, 403, 404, 405 and so forth. Next, the payload creation unit 612 performs LZ77 compression on the data in each plaintext block.

The plaintext block 401 is compressed to a 24-bit compression payload 421 having a range from the start of the plaintext data 400 to the compression target as the sliding dictionary. The plaintext block 402 is compressed to a 40-bit compression payload 422 having the range 412 from the start of the plaintext data 400 to the compression target as the sliding dictionary. The plaintext block 403 is compressed to a 48-bit compression payload 423 having the range 413 from the start of the plaintext data 400 to the compression target as the sliding dictionary. The plaintext block 404 is compressed to a 16-bit compression payload 424 having the range 414 from the start of the plaintext data 400 to the compression target as the sliding dictionary. The plaintext block 405 is compressed to a 40-bit compression payload 425 having the range 415 from the start of the plaintext data 400 to the compression target as the sliding dictionary. Thereafter, compression is performed in a similar fashion until the final plaintext block of the plaintext data. In this specific example, the dictionary range for each plaintext block always begins at the start of the plaintext data 400, but in subsequent plaintext blocks, when the character string size included in the sliding dictionary reaches a prescribed dictionary size, the start of the sliding dictionary range slides to the rear of the plaintext data 400 similar to conventional LZ77 compression. Thereafter, the character string included in the sliding dictionary becomes a dictionary-size character string further in the past than the compression target.

The compression headers 431, 432, 433, 434, 435 and so forth are data indicating the bit lengths of the respective compression payloads 421, 422, 423, 424, 425 and so forth. The ultimate compressed data 440 is a bit stream in which compression blocks, which are combinations of compression headers and compression payloads, are concatenated.

According to this data compression process, it is possible to divide plaintext data into a plurality of plaintext blocks of the same size, to compress the plaintext blocks using LZ77 compression to create compression payloads, and to attach compression headers indicating the compression payloads. This makes it possible, in the data decompression process, to extract a compression payload on the basis of the compression header even when the lengths of the plurality of compression payloads differ, and in addition, makes it possible to extract the next compression block.

Data decompression processing of this example will be explained below.

Figure 7:
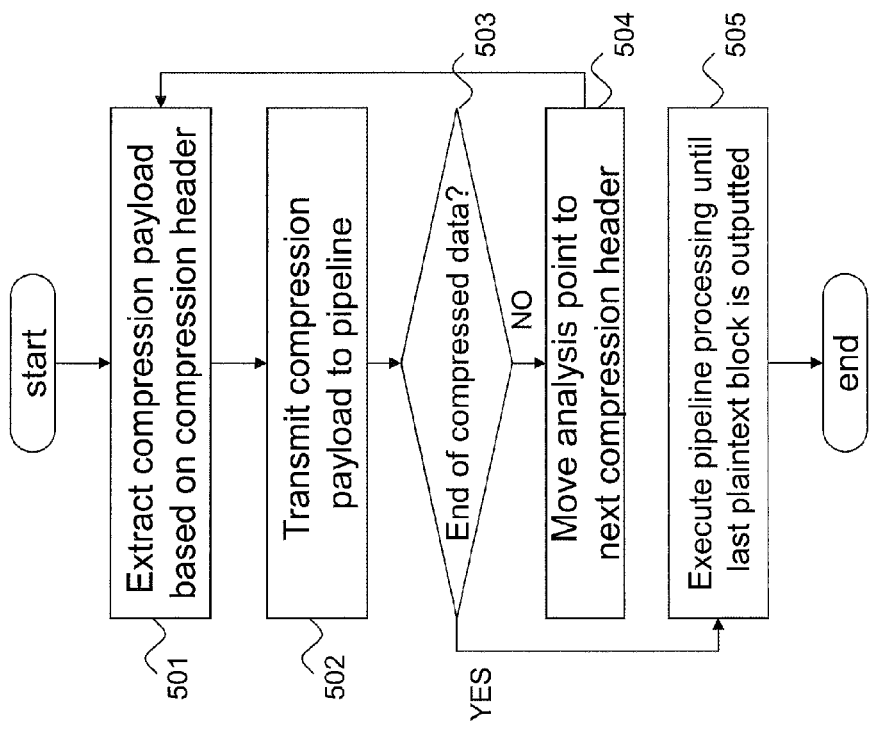
FIG. 7 shows data decompression processing of the first example.

FIG. 7 shows the data decompression processing in the first example.

The payload extraction unit 621 includes a buffer register. First, the payload extraction unit 621 receives the compressed data inputted in the buffer register, and sets an analysis pointer for indicating the position in a bit pattern that is to be analyzed at the start of the compressed data bit stream (that is, at the start of the initial compression header).

The payload extraction unit 621 analyzes the compression header starting from the analysis pointer, specifies, on the basis of the compression header, the compression payload length of the compression payload that follows this compression header, and extracts the compression payload on the basis of the compression payload length (501).

The payload extraction unit 621 sends the extracted compression payload to the pipelines of the code layout unit 622 and the character solving unit 623 (502).

The payload extraction unit 621 determines whether or not the end of the extracted compression payload is the end of the compressed data (503). When the end of the extracted compression payload is the end of the compressed data, the payload extraction unit 621 transitions to Step 505. Alternatively, when the end of the extracted compression payload is not the end of the compressed data, the payload extraction unit 621 moves the analysis pointer to the next compression header (504). Then, the payload extraction unit 621 transitions the processing to Step 501 once again.

In Step 505, the payload extraction unit 621 waits until the last compression payload sent to the pipelines of the code layout unit 622 and the character solving unit 623 has finished passing through the pipelines (505).

When the last plaintext block including the original plaintext data has been restored as described above and outputted from the character solving unit 623, the data decompression process is complete.

The series of processes of Steps 501 through 504 are repeated here a number of times equal to the number of compression blocks including the compressed data. The payload extraction unit 621 performs this processing during the time period of a single drive clock cycle. A person skilled in the art of logic circuit design will be able to easily design the hardware for the payload extraction unit 621. The payload extraction unit 621, for example, is a logic circuit having the following configuration.

(1) A buffer register for storing compressed data inputted from outside;
(2) A bit pattern decoder that is connected to the first portion of the buffer register, and is for analyzing a compression header;
(3) A data loader for extracting a payload on the basis of the decode result of the bit pattern decoder, and transferring this payload to the above-mentioned pipelines; and
(4) A barrel shifter for moving data on the basis of the decode result of the bit pattern decoder such that the next compression header arrives at the start of the buffer register.

These circuit elements operate simultaneously in the payload extraction unit 621. In accordance with this, one compression payload is extracted from within the compressed data bit stream each cycle. Each compression payload is transferred to the pipelines of the code layout unit 622 and the character solving unit 623 each cycle.

Figure 8:
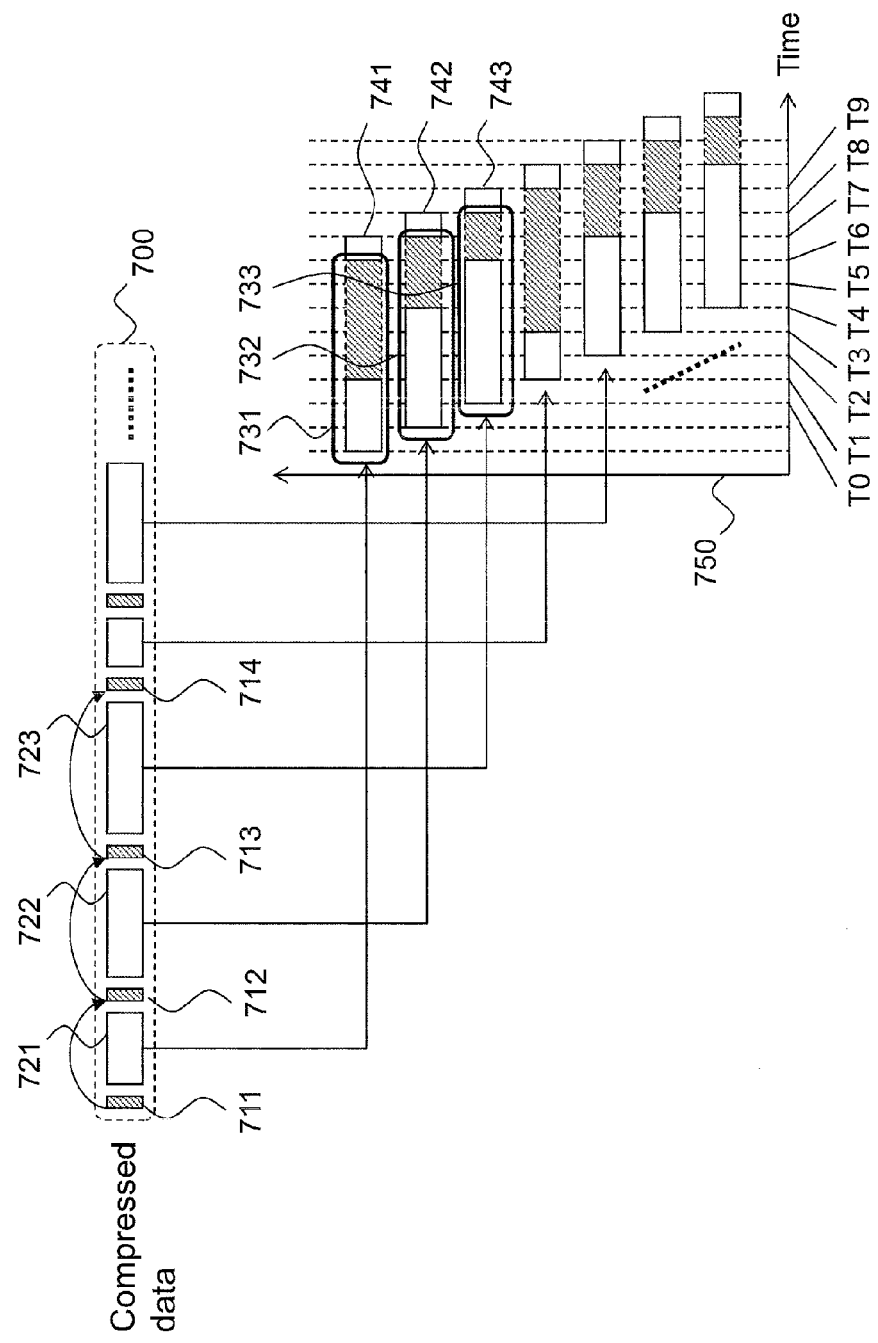
FIG. 8 shows a specific example of the operation of a payload extraction unit 621.

FIG. 8 shows a specific example of the operation of the payload extraction unit 621.

The drawing shows the configuration of the compressed data 700, and a timing chart 750 indicating the operation of the pipelines.

During the initial cycle of the drive clock, the payload extraction unit 621, on the basis of the compression payload length indicated by the first compression header 711 in the compressed data 700, extracts the compression payload 721 subsequent to the compression header 711 and sends the compression payload 721 to the pipelines, and moves the analysis pointer to the next compression header 712. During the next cycle, the payload extraction unit 621, on the basis of the compression payload length indicated by the compression header 712, extracts the compression payload 721 subsequent to the compression header 712 and sends the compression payload 722 to the pipelines, and moves the analysis pointer to the next compression header 713. During the next cycle, the payload extraction unit 621, on the basis of the compression payload length indicated by the compression header 713, extracts the compression payload 723 subsequent to the compression header 713 and sends the compression payload 723 to the pipelines, and moves the analysis pointer to the next compression header 714. Thereafter, the payload extraction unit 621 extracts the compression payloads in the same way until the compressed data ends.

The timing chart 750 indicates, for each compression payload, the data decompression operation period for the pipelines of the code layout unit 622 and the character solving unit 623.

The operation period 731 indicates the timing at which the compression payload 721 is processed by the code layout unit 622. The operation period 732 indicates the timing at which the compression payload 722 is processed by the code layout unit 622. The operation period 733 indicates the timing at which the compression payload 723 is processed by the code layout unit 622.

The operation period 741 indicates the timing at which the compression payload 721 is processed by the character solving unit 623. The operation period 742 indicates the timing at which the compression payload 722 is processed by the character solving unit 623. The operation period 743 indicates the timing at which the compression payload 723 is processed by the character solving unit 623.

Thus, the timing of the pipeline processing of the code layout unit 622 and the character solving unit 623 for each of the plurality of compression payloads including the compressed data 700 shifts one cycle at a time. When the plaintext block length is eight bytes, the code layout unit 622 and the character solving unit 623 perform eight pipeline processes at the same time. The code layout unit 622 pipeline converts the compression payloads to an intermediate block in eight cycles, and the character solving unit 623 pipeline converts the intermediate block to a plaintext block in one cycle.

Figure 9:
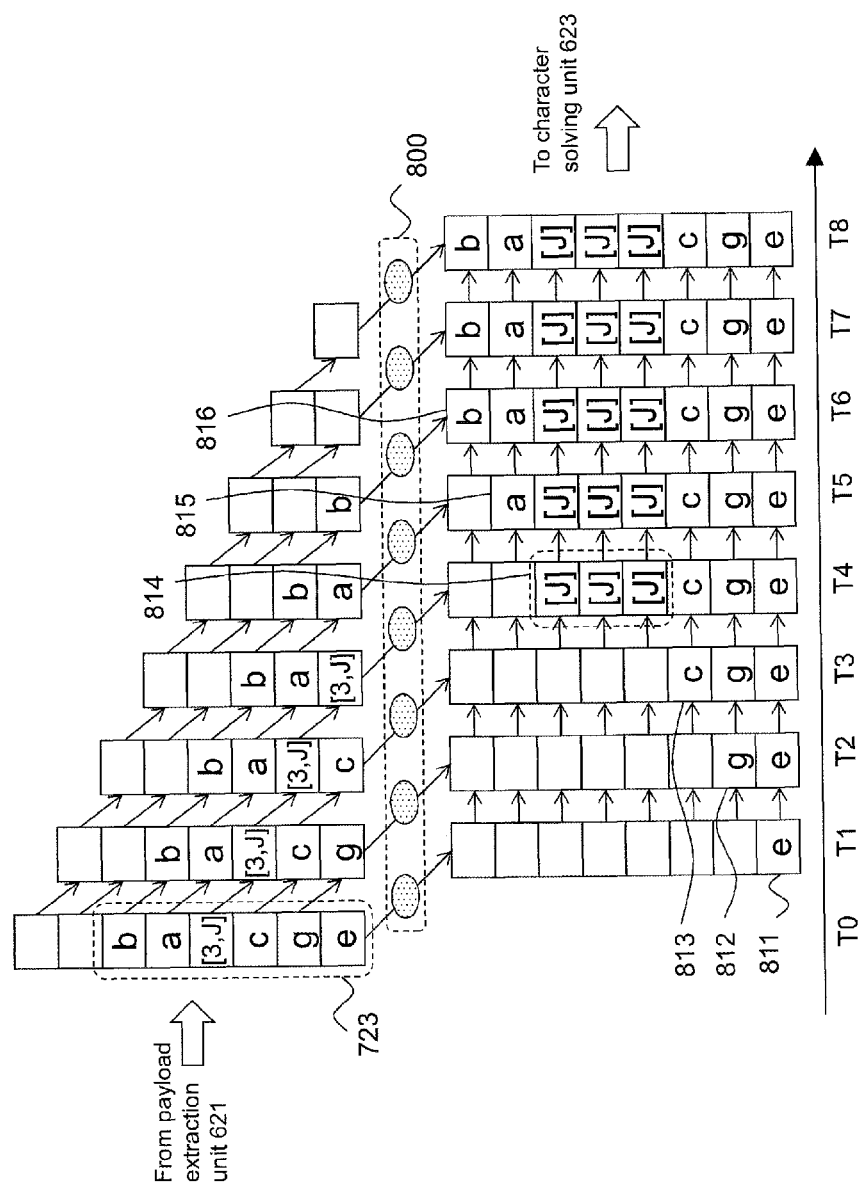
FIG. 9 shows specific examples of the configuration and operation of a code layout unit 622.

FIG. 9 shows a specific example of the configuration and operation of the code layout unit 622.

The code layout unit 622 includes a bit pattern decoder 800, and uses the bit pattern decoder 800 to analyze the first portion of the bit stream of each compression payload. The bit pattern decoder 800 has a function for creating an intermediate block corresponding to the compression payload. An intermediate block is intermediate data in a data decompression process, has the same length as the plaintext block, and has an N-character (8-character) element.

As described hereinabove, the element of the compression payload is either a bit pattern indicating a literal character, or a bit pattern indicating a copy symbol [L, J]. The bit pattern decoder 800, upon detecting a bit pattern indicating a literal character at the start of the bit stream, appends the literal character to the intermediate block. Also, upon detecting a bit pattern indicating the copy symbol [L, J], the bit pattern decoder 800 appends the same number of indeterminate characters [J] as the copy length L to the intermediate block.

This specific example shows the operation of the code layout unit 622 relative to the compression payload 723 described hereinabove. For example, the compression payload 723 is the bit stream "e,g,c,[3,J],a,b". The bottommost row in the compression payload 723 of this drawing shows the first bit pattern. The processing of the compression payload 723 in the pipeline is performed from time T0 to time T8 in the timing chart 750.

At time T0, the code layout unit 622 detects the bit pattern of the initial "e" from the compression payload 723 bit stream. At time T1, the code layout unit 622 configures a literal character "e" 811 in the intermediate block. At the same time, the code layout unit 622 shifts forward along the bit stream and detects the bit pattern of "g" next. At time T2, the code layout unit 622 appends the literal character "g" 812 to the intermediate block. At the same time, the code layout unit 622 shifts forward along the bit stream and detects the bit pattern of "c" next. At time T3, the code layout unit 622 appends the literal character "c" 813 to the intermediate block. At the same time, the code layout unit 622 shifts forward along the bit stream and detects the bit pattern of the copy symbol [3, J]. At time T4, the code layout unit 622 appends the three indeterminate characters [J] 814 to the intermediate block. At the same time, the code layout unit 622 shifts forward along the bit stream and detects the bit pattern of "a". At time T5, the code layout unit 622 appends the literal character "a" 815 to the intermediate block. At the same time, the code layout unit 622 shifts forward along the bit stream and detects the bit pattern of "b". At time T6, the code layout unit 622 appends the literal character "b" 816 to the intermediate block. With that, the code layout unit 622 completes the N-character (8-character) entry to the intermediate block. At the same time, the code layout unit 622 shifts forward along the bit stream, resulting in an empty bit stream.

From this point up to T8, the code layout unit 622 does not perform bit pattern analysis. Thus, the contents of the intermediate block do not change at times T7 and T8. The timing chart 750 indicates a period during which the intermediate block contents do not change in the code layout unit 622 with diagonal lines. No matter which bit stream the compression payload is, the compression payload is a maximum N-byte (8-byte) bit pattern string, and as such, after entering the code layout unit 622, an intermediate block corresponding thereto is invariably completed after N cycles (eight cycles).

In accordance with this, the compression payload 723 is converted to the intermediate block "e,g,c,[J],[J],[J],a,b". In this intermediate block, the five literal characters (e,g,c,a,b) signify that these characters will be entered into these positions in the plaintext block. Alternatively, the three indeterminate characters [J] indicate the numerical value J, and simply signify that literal characters, which are separated in the past by J, will be entered into these positions in the plaintext block, but what characters will be entered has yet to be solved. Thereafter, the character solving unit 623 solves the indeterminate characters.

In this specific example, the code layout unit 622 is an N-stage (8-stage) pipeline-mode arithmetic circuit, and as such, a bit stream of eight compression payloads is processed simultaneously by eight bit pattern decoders 800 lined up transversely. This specific example only shows the processing of the code layout unit 622 with respect to the compression payload 723, but processing is also progressing simultaneously on other registers for the other seven compression payloads. For example, at time T3, the intermediate block corresponding to the compression payload 723 is on the third register from the left, the intermediate block corresponding to the compression payload 722 is on the fourth register from the left, and the intermediate block corresponding to the compression payload 721 is on the fifth register from the left.

The code layout unit 622 is able to create, from a compression payload, an intermediate block having a length of N characters by converting a code word to a literal character when the code word in the compression payload indicates a literal character, and converting the code word to an indeterminate character, which is undetermined, when the code word indicates a character other than a literal character. This makes it possible for the last-stage character solving unit 623 to process N characters at a time during a single cycle.

Figure 10:
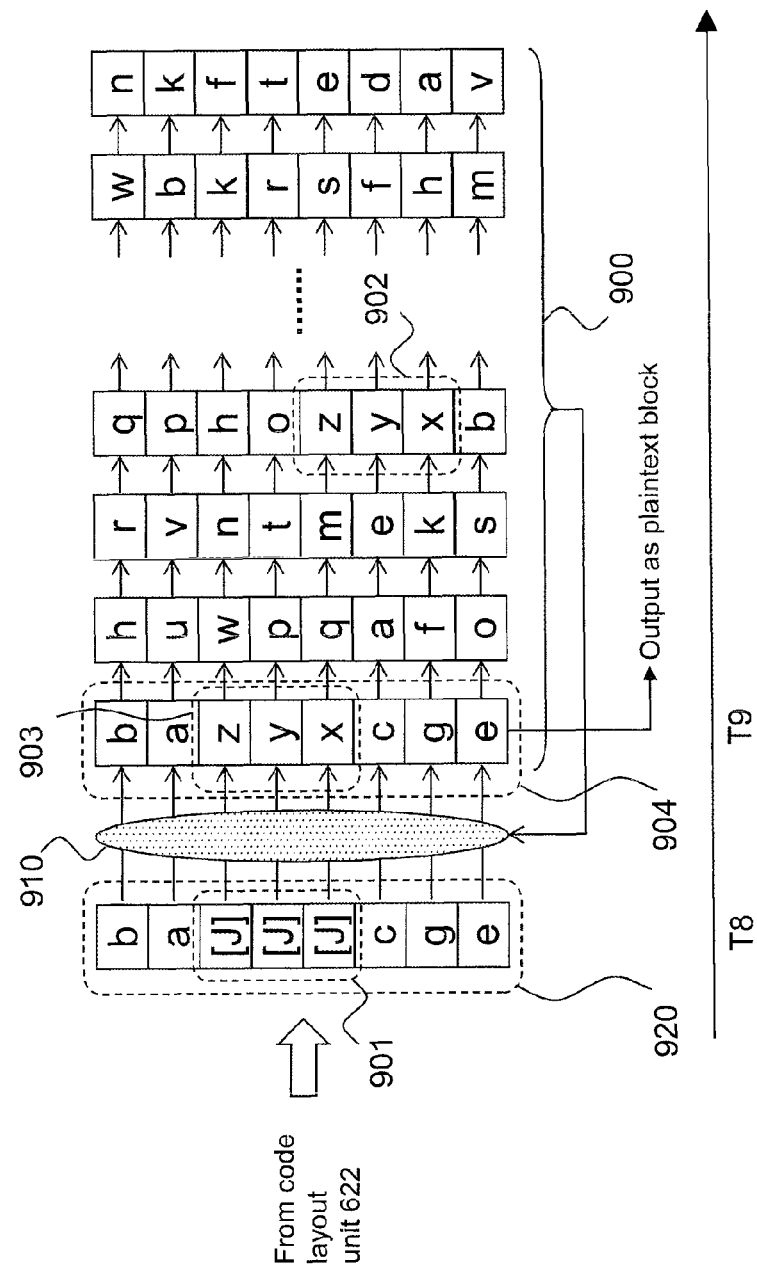
FIG. 10 shows specific example of the configuration and operation of a character solving unit 623.

FIG. 10 shows a specific example of the configuration and operation of the character solving unit 623.

The character solving unit 623 is installed for follow-on processing subsequent to that of the code layout unit 622, and includes a dictionary register 900 and a data selector 910. The dictionary register 900 realizes the sliding dictionary. The data selector 910 detects an indeterminate character in an intermediate block outputted from the code layout unit 622. Then, from the dictionary register 900, the data selector 910 selects a character indicated by the indeterminate character string 901, creates a plaintext block by replacing the indeterminate character with the selected character, outputs the plaintext block, and, in addition, inputs the plaintext block to the dictionary register 900.

This specific example shows the operation of the character solving unit 623 with respect to an intermediate block 920 corresponding to the compression payload 723. The intermediate block 920 is inputted to the character solving unit 623 at time T8. The bottommost row of this drawing shows the first character in the intermediate block 920. The data selector 910 detects a three-character long indeterminate character string 901 inside the intermediate block 920. Thereafter, the data selector 910 selects from the dictionary register 900 a three-character long character string J-characters in front of the position of the indeterminate character string 901. For example, when the J in the indeterminate character string 901 indicates 26, the character string 902 "x,y,z" that is 26 characters in front of the indeterminate character string 901 in the dictionary register 900 corresponds to the indeterminate character string 901. In the dictionary register 900 of this drawing, each column indicates a plaintext block, and a character in a lower position in the plaintext block indicates a past character. A position rightward of a character in the plaintext block indicates a past character by the number of characters of the plaintext block length. Therefore, the data selector 910 determines a character string 903 by replacing the indeterminate character string 901 with the character string 902. In accordance with this, plaintext block 904 "e,g,c,x,y,z,a,b" corresponding to the compression payload 723 is restored at time T9.

The restored N-character (8-character) plaintext block 904 is outputted from the decompression circuit 620 as a part of the plaintext data, and at the same time is added to the dictionary register 900. The dictionary register is an N-character (8-character) shift register, and when a new plaintext block is added from the left end, the oldest plaintext block is discarded from the right end. The number of stages in the dictionary register 900 is obtained by dividing the dictionary size by N.

The character solving unit 623 is able to restore the plaintext block by replacing the indeterminate character with a literal character in the dictionary register 900. Furthermore, the character solving unit 623 is able to increase the output throughput to N-times the drive clock by processing N characters at a time in a single cycle.

Thus, the decompression circuit 620, by recognizing a compression header for each of a plurality of compression blocks, is able to extract payloads from compressed data on the basis of payload lengths indicated in the recognized headers. In addition, the decompression circuit 620 is able to restore a plaintext block by decompressing the payloads using a sliding dictionary-type compression algorithm.

Also, the payload extraction unit 621 is able to extract one compression payload per cycle from compressed data, the pipelines of the code layout unit 622 and the character solving unit 623 are able to restore a plaintext block and output plaintext data N characters at a time per cycle. Therefore, the decompression throughput for data compressed using the sliding dictionary-type compression algorithm is a prescribed value at all times regardless of the data content. This throughput can be arbitrarily stipulated at the hardware design stage. This makes it possible, for example, to guarantee high-speed read performance for compressed data in a storage system having a data compression function.

When data compression/decompression using a sliding dictionary-type algorithm is performed by software, in most cases compression is done in file units. Therefore, the plaintext data is large in size, and the dictionary is large in size. Alternatively, the flash memory storage 101 of this example performs read/write in units of pages (several kB), and as such, enables the size of the plaintext data and the size of the dictionary to be kept smaller than in software-based data compression/decompression.

Example 2

An example for making the size of the compressed data smaller and improving compressibility will be explained below.

The first example reduces the data amount by converting a character string that matches up with a past character string to a copy symbol by using LZ77 compression, but in this example, secondary compression is performed as well. When the copy distance J of a plurality of successive copy symbols is the same, a secondary compression further reduces the data amount by combining the copy symbols to make a single copy symbol.

Figure 11:
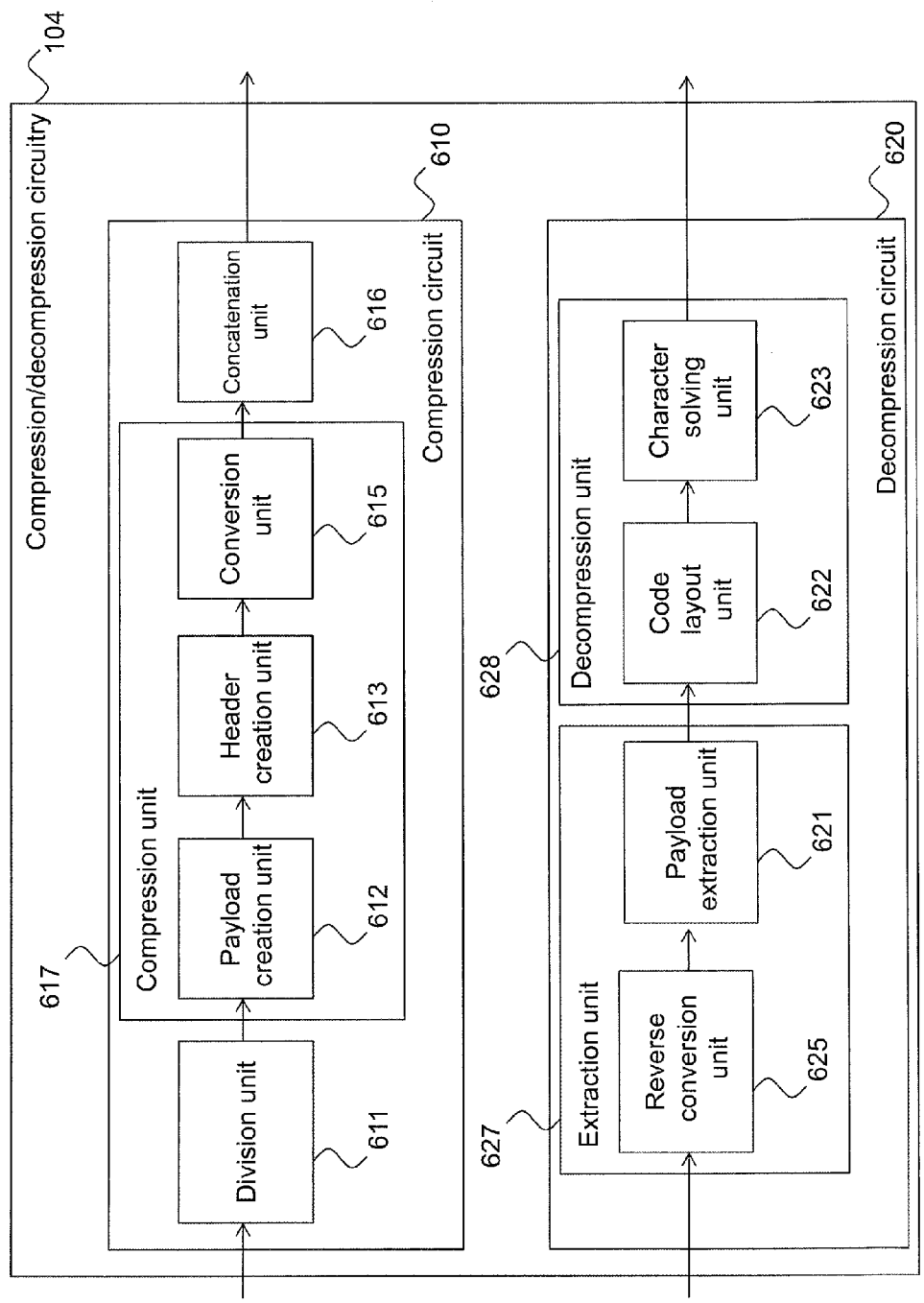
FIG. 11 shows the configuration of compression/decompression circuitry 104 of a second example.

FIG. 11 shows the configuration of compression/decompression circuitry 104 of the second example.

In this drawing, elements that have been assigned the same reference symbols as in the first example are either the same as or correspond to the elements of the compression/decompression circuitry 104 of the first example. The compression unit 617 of this example, in addition to the elements of the compression unit 617 in the first example, includes a conversion unit 615 for secondary compression. The extraction unit 627 of this example, in addition to the elements of the extraction unit 627 in the first example, includes a reverse conversion unit 625 for decompressing the secondary compression.

The conversion unit 615, in a case where each of a plurality of successive compression payloads is a single copy symbol, and, in addition, the copy distance J of the copy symbols is the same, converts the copy symbols to a single copy symbol.

FIG. 12 shows a specific example of secondary compression.

This drawing shows a case in which N is 8. It is assumed that the payload creation unit 612 has discovered, in a position J characters in the past within the sliding dictionary, a character string that is the same as a character string in three successive plaintext blocks. In this example, the length of the three successive plaintext block character strings is eight characters×3=24 characters. The payload creation unit 612 respectively converts the three plaintext blocks to compression payloads 1011, 1012, and 1013 using a data compression process similar to that of the first example. Each of the compression payloads 1011, 1012, and 1013 constitutes a copy symbol [8, J], and the same copy symbol is lined up three in a row. Then, the header creation unit 613 adds compression headers 1001, 1002 and 1003 to the compression payloads 1011, 1012, and 1013.

Since the copy distance J of the copy symbols of the three successive compression payloads 1011, 1012 and 1013 is the same, the conversion unit 615 creates a compression payload 1021 by adding up and integrating the 8-character copy lengths of the three copy symbols into a single 24-character copy length, and converting the three copy symbols [8, J] to a single copy symbol [24, J]. In addition, the conversion unit 615 converts the compression headers 1001, 1002, and 1003 to a compression header 1020 indicating the length of the compression payload 1021. According to this conversion, three sets of compression headers and compression payloads are reduced to one, thereby making it possible to further reduce the data amount of the compressed data more than in the first example. In addition, the compression header 1020 includes combination information indicating that the compression payload 1021 is a combined copy symbol.

Thus, the compression circuit 610 is able to perform processing besides that of the conversion unit 615 the same as in the first example.

To decompress the compressed data that was subjected to secondary compression, the reverse conversion unit 625 determines whether or not the compression header 1020 includes the combination information. When the compression header 1020 includes the combination information, the reverse conversion unit 625 acquires the combined copy symbol from the one subsequent compression payload 1011, and as a reverse conversion of the conversion unit 615, converts the compression payload 1021 to a plurality (M) of copy symbols to create M compression payloads 1011, 1012, and 1013. At this point, the copy length L of the combined copy symbol is N×M. The compression payloads 1011, 1012 and 1013 are transferred to the code layout unit 622 one at a time over M cycles. When the compression header 1020 does not include the combination information, the payload extraction unit 621 transfers one compression payload to the code layout unit 622 per cycle the same as in the first example.

Thus, the decompression circuit 620 is able to perform processing besides that of the reverse conversion unit 625 the same as in the first example.

The extraction unit 627 may determine that the compression payload is a combined copy symbol without using the combination information. For example, when the compression payload shows a copy symbol, and, in addition, the copy length is M-times the plaintext block length, the extraction unit 627 may convert the compression payload to M successive copy symbols.

Variations of the examples described hereinabove will be explained below.

The compression circuit 610 and the decompression circuit 620 may be mutually different devices.

As a first variation, an example of a storage system including a storage controller, a first storage apparatus connected to the storage controller, and a second storage apparatus connected to the storage controller will be explained. The first storage apparatus includes a compression circuit 610, and the second storage apparatus includes a decompression circuit 620. The first storage apparatus reads data, compresses the data to convert the data to compressed data by using the compression circuit 610, and sends the compressed data to the storage controller, the storage controller sends the received compressed data to the second storage apparatus, and the second storage apparatus uses the decompression circuit 620 to decompress the received compressed data, and stores the decompressed data. In this case, by decreasing the amount of data transmitted, it is possible to reduce the loads on the storage controller, the communication line between the storage controller and the first storage apparatus, and the communication line between the storage controller and the second storage apparatus.

As a second variation, an example of a communication system including a first communication apparatus, and a second communication apparatus connected to the first communication apparatus via a network will be explained. The first communication apparatus includes a compression circuit 610, and the second communication apparatus includes a decompression circuit 620. The first communication apparatus compresses inputted data to convert the inputted data to compressed data by using the compression circuit 610, and sends the compressed data to the second communication apparatus, and the second communication apparatus uses the decompression circuit 620 to decompress the received compressed data, and outputs the decompressed data. In this case, by decreasing the amount of data transmitted, it is possible to reduce the load on the network. It is also possible to guarantee the network communication speed since the decompression circuit 620 performs decompression at a predetermined output throughput.

The flash memory storage 101 may be a cache device.

As a third variation, an example of a computer system that uses a flash memory storage 101 as a cache device will be explained. The computer system of the third variation includes either an HDD or a flash memory device as a storage device in addition to the components of the computer system of the first example. The storage device is connected to the higher-level controller 110. The higher-level controller 110 transmits write data to a cache device in accordance with a write command. In the cache device, a compression circuit 610 creates compressed write data by compressing the write data, and a flash memory 105 stores the compressed write data. The flash memory 105 may store the write data. The higher-level controller 110 transmits the compressed write data to the storage device, and writes the compressed write data to the storage device. In response to a read command, the higher-level controller 110 reads the data in the storage device as compressed read data, and transmits the compressed read data from the storage device to the cache device. The flash memory 105 stores the compressed read data in the cache device, and the decompression circuit 620 creates read data by decompressing the compressed read data. The flash memory 105 may store the read data. The higher-level controller 110 transmits the read data from the cache device. This makes it possible to reduce the data amount stored in the storage device, and, in addition, to reduce the data amount transmitted between the cache device and the storage device. It is also possible to guarantee the throughput of reads in the computer system.

The compression circuit 610 and the decompression circuit 620 in the examples and variations described hereinabove may use a sliding dictionary-type compression algorithm other than the LZ77.

REFERENCE SIGNS LIST

101 Flash memory storage
103 Flash memory controller
104 Compression/decompression circuitry
105 Flash memory
107 Microprocessor
110 Higher-level controller
610 Compression circuit
611 Division unit
612 Payload creation unit
613 Header creation unit
615 Conversion unit
616 Concatenation unit
617 Compression unit
620 Decompression circuit
621 Payload extraction unit
622 Code layout unit
623 Character solving unit
625 Reverse conversion unit
627 Extraction unit
628 Decompression unit

The invention claimed is:

1. A data compression apparatus comprising:
a division unit that divides plaintext data inputted to the division unit into a plurality of plaintext blocks each having a prescribed plaintext block length;
a compression unit that creates a payload for each plaintext block of the plurality of plaintext blocks by compressing the plaintext block using a sliding dictionary-type compression algorithm, creates a header indicating the length of the payload, and creates a compression block that includes the header and the payload; and
a concatenation unit that creates compressed data by concatenating a plurality of compression blocks created from the plurality of plaintext blocks,
wherein the plaintext block length is a value obtained by dividing an output throughput for data decompressed by a logic circuit that decompresses the compressed data, by a frequency of a drive clock in the logic circuit.

2. A data compression apparatus according to claim 1, wherein the compression unit, in a case where first data in the plaintext block matches past second data in the plaintext data, makes use of a copy symbol that indicates a copy distance indicating a distance from the first data to the second data and a copy length, which is the length of the first data, to convert the first data to the copy symbol, and includes a code word indicating the copy symbol in the payload, and
when each of M successive payloads in a plurality of payloads created from the plurality of plaintext blocks indicates a same first copy symbol, and, in addition, the copy length of the first copy symbol is the plaintext block length, the compression unit converts the M payloads to a single second copy symbol, and specifies M-times the plaintext block length as the copy length of the second copy symbol.

3. A data decompression apparatus comprising:
an extraction unit that uses compressed data created by: dividing plaintext data into a plurality of plaintext blocks, each of the plurality of plaintext blocks having a prescribed plaintext block length; creating a payload for each plaintext block of the plurality of plaintext blocks by compressing the plaintext block using a sliding dictionary-type compression algorithm; creating a header that indicates the length of the payload; creating a compression block that includes the payload and the header; and concatenating a plurality of compression blocks created with respect to the plurality of plaintext blocks, to recognize each header of the plurality of compression blocks from the compressed data, and extract a payload from the compressed data on the basis of the payload length indicated in the recognized header; and
a decompression unit that restores the plaintext block by decompressing the extracted payload using the sliding dictionary-type compression algorithm
wherein the plaintext block length is a value obtained by dividing an output throughput for a plaintext block restored by the decompression unit, by a frequency of a drive clock in the decompression unit.

4. A data decompression apparatus according to claim 3, wherein the decompression unit creates an intermediate block having the plaintext block length from the extracted payload by, in a case where a code word in the extracted payload indicates a literal character, converting the code word to a literal character, and by, in a case where the code word indicates something other than a literal character, converting the code word to an indeterminate character, which is a character that indicates undetermined.

5. A data decompression apparatus according to claim 4, wherein the decompression unit creates a plaintext block from the intermediate block by converting the indeterminate character to a literal character that is in a sliding dictionary, and stores the created plaintext block in the sliding dictionary.

6. A data decompression apparatus according to claim 5, wherein the decompression unit includes a pipeline that decompresses the extracted payload.

7. A data decompression apparatus according to claim 6, wherein the decompression unit restores one plaintext block for each cycle of the drive clock.

8. A data decompression apparatus according to claim 3, wherein, in a case where first data in the plaintext block matches past second data in the plaintext data, a copy symbol that indicates a copy distance indicating a distance from the first data to the second data, and a copy length, which is the length of the first data, is used to convert the first data to the copy symbol, and a code word indicating the copy symbol is included in the payload, and in a case where the extracted payload indicates a third copy symbol, and, in addition, the copy length of the third copy symbol indicates M times the plaintext block length, the extraction unit converts the extracted payloads to M successive fourth copy symbols, and specifies the plaintext block length as the copy length of the fourth copy symbol.

* * * * *